United States Patent [19]
Nozue

[11] Patent Number: 5,607,801
[45] Date of Patent: Mar. 4, 1997

[54] DIRECT PATTERNING METHOD OF RESIST FILM USING ELECTRON BEAM

[75] Inventor: Hiroshi Nozue, Tokyo, Japan

[73] Assignee: NEC Corporation, Tokyo, Japan

[21] Appl. No.: 354,807

[22] Filed: Dec. 13, 1994

[30] Foreign Application Priority Data

Dec. 14, 1993 [JP] Japan ................................. 5-312401

[51] Int. Cl.$^6$ ............................. G03F 9/00; G03C 5/00
[52] U.S. Cl. ..................... 430/22; 430/296; 430/942
[58] Field of Search ............................ 430/22, 296, 942

[56] References Cited

U.S. PATENT DOCUMENTS

| 4,264,711 | 4/1981 | Greeneich | 430/296 |
| 4,576,884 | 3/1986 | Reisman | 430/942 |
| 5,478,698 | 12/1995 | Rostoker et al. | 430/942 |

FOREIGN PATENT DOCUMENTS

| 3939456 | 6/1991 | Germany | 430/942 |
| 60-246631 | 12/1985 | Japan | 430/296 |
| 61-164222 | 7/1986 | Japan | 430/296 |
| 61-292319 | 12/1986 | Japan | 430/296 |
| 5-136027 | 6/1993 | Japan | 430/296 |
| 5-136035 | 6/1993 | Japan | 430/296 |

OTHER PUBLICATIONS

G. Anderson et al., "E–Beam Three–Mark Registration for Vertical Wiring Processes", IBM Technical Disclosure Bulletin, vol. 27, No. 1A, pp. 256–257 Jun. 1984.

D. Holborn et al., "A pattern recognition technique using sequences of marks for registration in electron beam lithography", J. Vac. Sci. Technol., vol. 19, No. 4, pp. 1229–1233 Nov. 1981.

*Primary Examiner*—Anthony McFarland
*Assistant Examiner*—J. Pasterczyk
*Attorney, Agent, or Firm*—Burns, Doane, Swecker & Mathis, LLP

[57] ABSTRACT

A direct patterning method using an electron beam, which contains first and second steps. In the first step, a first beam of incident electrons accelerated at a first voltage is irradiated to an electron resist film and scanned. The first voltage is set so that the electrons penetrate the resist film to be back-scattered by a semiconductor substrate having an alignment mark and pass through the film again. Secondary electrons generated at the surface of the resist film due to the back-scattered electrons are detected by an electron detector to recognize the alignment mark. In the second step, a second beam of incident electrons accelerated at a second voltage lower than the first voltage is irradiated to the resist film and scanned by reference to the alignment mark to write a given pattern in the resist film. Since the back-scattered electrons from the first beam have sufficiently high energies, they can penetrate the resist film to reach its surface and generate many secondary electrons on the surface of the film. An electric signal produced from the secondary electrons is large in amplitude to increase the S/N, resulting in improvement in alignment accuracy.

9 Claims, 4 Drawing Sheets

DIRECT PATTERNING METHOD OF RESIST FILM USING ELECTRON BEAM

BACKGROUND OF THE INVENTION

1. Field of the Invention

The present invention relates to electron beam lithography and more particularly, to a direct patterning method of a resist film using an electron beam, which is applicable for semiconductor device fabrication such as circuit pattern formation in an electron resist film placed on or over a semiconductor substrate.

2. Description of the Prior Art

In recent years, a great variety of semiconductor integrated circuit devices each of which is fabricated in a small amount, such as custom large-scale integrated circuit devices (LSIs) and semicustom LSIs, have been increasingly demanded designed and produced.

To fabricate such devices as above, a direct writing or drawing method of a resist film placed on or over a semiconductor wafer using an electron beam has been developed and employed. With this method, a mask and a reticle as required for the conventional projection exposure method are not needed and desired patterns are directly written in the resist film according to the pattern data generated in a pattern generator. As a result, the direct writing method offers an advantage that the fabrication term of the semiconductor device is shortened and that the fabrication cost thereof is reduced, both of which are due to the lack of a mask and reticle.

A conventional direct patterning method of this sort is described below referring to FIGS. 1A and 1B, which is carried out by a conventional scanning electron-beam exposure system.

To accomplish the semiconductor devices such as LSIs on a semiconductor wafer, in general, resist-patterning processes are repeated several or several tens times for the same wafer. In other words, a lot of patterns are written sequentially in corresponding resist films for the same wafer. Therefore, it is very important for all the given patterns to be overlaid accurately. Otherwise the devices on the wafer will not meet the performance specifications.

Accordingly, several alignment marks, which may be etched trenches, metal layers or the like, are formed on or over the surface of the semiconductor wafer in advance. An electron beam is irradiated to scan an exposure field of the wafer prior to each pattern writing process in order to recognize the marks. Then, the beam is scanned again over the exposure field by reference to the marks in order to write corresponding one of the given patterns.

Specifically, as shown in FIG. 1A, a silicon (Si) wafer 301 has an alignment mark 305 formed by an etched trench in an exposure field of the wafer 301. On the surface of the wafer 301, a silicon dioxide ($SiO_2$) film 302 with a thickness of 0.5 to 2 µm, an aluminum (Al) fill 303 with a thickness of 0.5 to 1.5 µm, and an electron resist film 304 with a thickness of 2.1 to 2.5 µm are formed in this order.

In the case of patterning the Al film 303, an electron beam EB produced by an electron gun is irradiated to the exposure field of the semiconductor wafer 301 held on a wafer table, and is scanned along the direction W to cross the alignment mark 305.

The acceleration voltage of the incident electrons of the beam EB is typically 20 kV to 50 kV. When the acceleration voltage is lower than 20 kV, the electron beam EB fluctuates in electron density at the spot formed on the resist fill 304 so that the electron density decreases on average. Thus, the pattern writing process takes a longer time than the came of 20 kV to 50 kV because of an increased interaction time between the incident electrons and the resist film.

In addition, small patterns cannot be written because the incident electrons are affected by their aberration.

On the other hand, when the acceleration voltage is higher than 50 kV, a part of the incident electrons of the beam EB penetrate the resist film 304, so that the resist film 304 decrease in sensitivity, i.e., the number of the electrons that contribute the interaction with the resist film reduces. As a result, also in the case, the pattern writing process takes a longer time than the case of 20 kV to 50 kV.

Almost all the incident electrons of the beam EB thus irradiated pass through the resist film 304, the Al film 303 and the $SiO_2$ film 302 and then strike the surface of the wafer 301 or the bottom face of the mark 305. The incident electrons thus struck are reflected by the surface of the wafer 301 or the bottom face of the mark 305 to be back-scattered electrons 53, respectively. The reference 52 indicates secondary electrons generated simultaneously with the secondary electrons 53 at the striking area of the mark 305. The secondary electrons 52 will disappear in the vicinity of the striking area because they have a kinetic energy as low as 100 eV or less.

The back-scattered electrons 53 pass through the $SiO_2$ film 302 to strike the back surface of the Al film 303, so that secondary electrons 54 are generated at the striking positions or areas to enter the Al film 303, respectively.

The back-scattered electrons 53 have high kinetic energies, almost the same as those of the incident electrons of the beam EB. Therefore, the electrons 53 can pass through all of the $SiO_2$, Al and resist films 302, 303 and 304 to go out of the resist film 304.

To recognize the alignment mark 305 during the scan, an electron detector of the scanning electron-beam exposure system continues to detect the back-scattered electrons 53 to produce an electric signal as a function of position on the surface of the wafer 301.

As shown in FIG. 1B, the signal produced by the back-scattered electrons 53 varies in amplitude at the alignment mark 305, so that the position of the mark 305 can be recognized from the signal. Then, a corresponding one of the pattern writing processes starts. The acceleration voltage of the beam EB for each writing process is equal to that for the mark-recognition process.

The back-scattered electrons 51 and the secondary electrons 55, which are generated at the surface of the resist film 304, are also detected by the electron detector, so that they produce noise on the signal.

With the conventional directly patterning method, when the total thickness of the $SiO_2$, Al and resist films 302, 303, and 304 is comparatively small, the signal produced by the back-scattered electrons 53 has a sufficiently large amplitude compared with the noise produced by the back-scattered and secondary electrons 51 and 55. As a result, all the given patterns can be written to be overlaid accurately in the resist film 304.

However, when the total thickness of the $SiO_2$, Al and resist films 302, 303, and 304 is comparatively large, the incident electrons of the electron beam EB tend to lose their kinetic energies partially or entirely before they reach the wafer 301 or the alignment mark 305. Therefore, almost all the back-scattered electrons 53 reflected by the surface of the wafer 301 or the bottom face of the mark 305 do not have the energies sufficient for passing through the films 302, 303 and 304 to go out of the film 304.

For example, the number of the back-scattered electrons 53 detected outside the resist film 304 decreases to one tenth (1/10) of that of the electrons 53 generated at the surface of the wafer 301 or the bottom face of the mark 305.

Thus, the electric signal produced by the back-scattered electrons 53 decreases in amplitude so that the signal cannot be distinguished from the noise, as shown in FIG. 1B, reducing the signal to noise ratio (S/N). As a result, there is a problem that the patterns written in the resist film 304 are not overlaid on each other exactly due to reduction of alignment accuracy, which leads to deterioration of fabrication yield.

SUMMARY OF THE INVENTION

Accordingly, an object of the present invention is to provide a direct patterning method of a resist film using an electron beam in which a plurality of patterns can be written which are to be overlaid in corresponding resist films placed on or over a semiconductor substrate with satisfactory accuracy of the overlays independently of a distance between the surface of each resist film and alignment marks of the substrate.

Another object of the present invention is to provide a direct patterning method of a resist film using an electron beam that enables improved accuracy in the overlay of patterns compared with that of the conventional method.

A direct patterning method of a resist film using an electron beam according to the present invention contains the following first and second steps.

In the first step, a first beam of incident electrons accelerated at a first voltage is irradiated to an electron resist film and scanned to cross an alignment mark of a semiconductor substrate. The first voltage is set so that the incident electrons of the first beam are reflected by the alignment mark to be back-scattered electrons that can reach the surface of the resist film. Secondary electrons generated at the surface of the resist film due to the back-scattered electrons are detected by an electron detector in order to recognize the alignment mark.

In the second step, a second beam of incident electrons accelerated at a second voltage lower than the first voltage is irradiated to the resist film and scanned over the substrate by reference to the alignment mark in order to write a given pattern in the resist film.

With the method of the invention, since the first helm of the incident electrons are accelerated at the first voltage higher than the first voltage, the back-scattered electrons produced by the first beam have sufficiently high kinetic energies. Therefore, the back-scattered electrons thus generated can pass through the resist film to reach its surface with keeping their high energies.

The back-scattered electrons generate a large number of secondary electrons at the surface of the resist film. Accordingly, if an electric signal is produced by detecting the back-scattered electrons, the signal becomes large in amplitude thereby to increase its S/N.

As a result, by repeating the first and second steps, a plurality of given patterns can be written in the corresponding resist films so as to be overlaid more accurately due to increase of alignment accuracy of the patterns than the conventional one. This means that the fabrication yield can be improved.

In addition, since the alignment accuracy of the patterns is improved, the patterns can be written with satisfactory accuracy of the overlay independent of the distance between the surface of each resist film and the alignment mark.

The second voltage may be set so that the second beam of the incident electrons writes the given pattern in the resist film well.

Preferably, the first voltage ranges from 100 kV to 250 kV. If the first acceleration voltage is lower than 100 kV, the aberration of the incident electrons of the first beam increases so that the number of the secondary electrons decreases. Therefore, a sufficient number of the secondary electrons is difficult to be obtain.

If the first acceleration voltage is higher than 250 kV, since the incident electrons of the first beam tend to penetrate the substrate, the obtainable number of the secondary electrons decreases, resulting in an insufficient number of secondary electrons.

The first acceleration voltage is more preferably 180 kV to 220 kV because a satisfactory accuracy of alignment can be obtained and electric discharge does not occur easily.

In a most preferable case, the first acceleration voltage is substantially equal to 200 kV because a comparatively satisfactory accuracy of alignment of given patterns can be obtained without electric discharge independent of the distance from the surface of the resist fill and the alignment mark.

DETAILED DESCRIPTION OF THE PREFERRED EMBODIMENTS

Figure 1A:
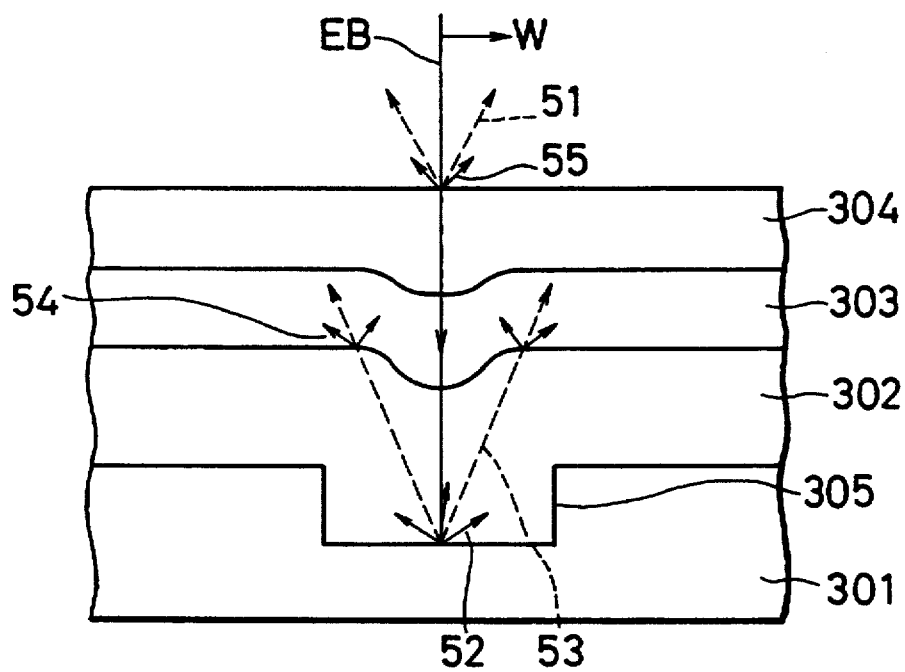
FIG. 1A is a partially cross-sectional view showing a conventional method of directly patterning a resist film using an electron beam.
Figure 1B:
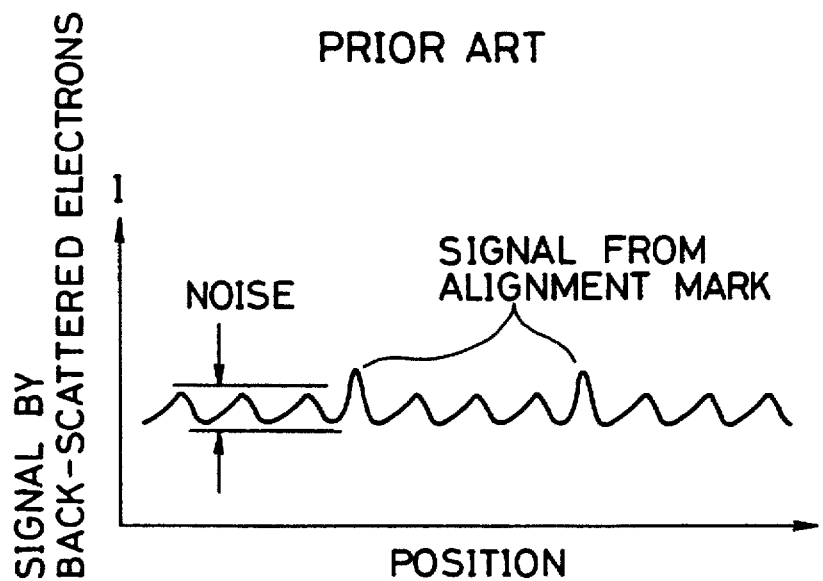
FIG. 1B is a graph showing a relationship between the position on the semiconductor substrate and the electric signal produced by the back-scattered electrons of the conventional method of FIG. 1A.

A preferred embodiment of the present invention will be described below referring to the drawings attached.

Figure 2:
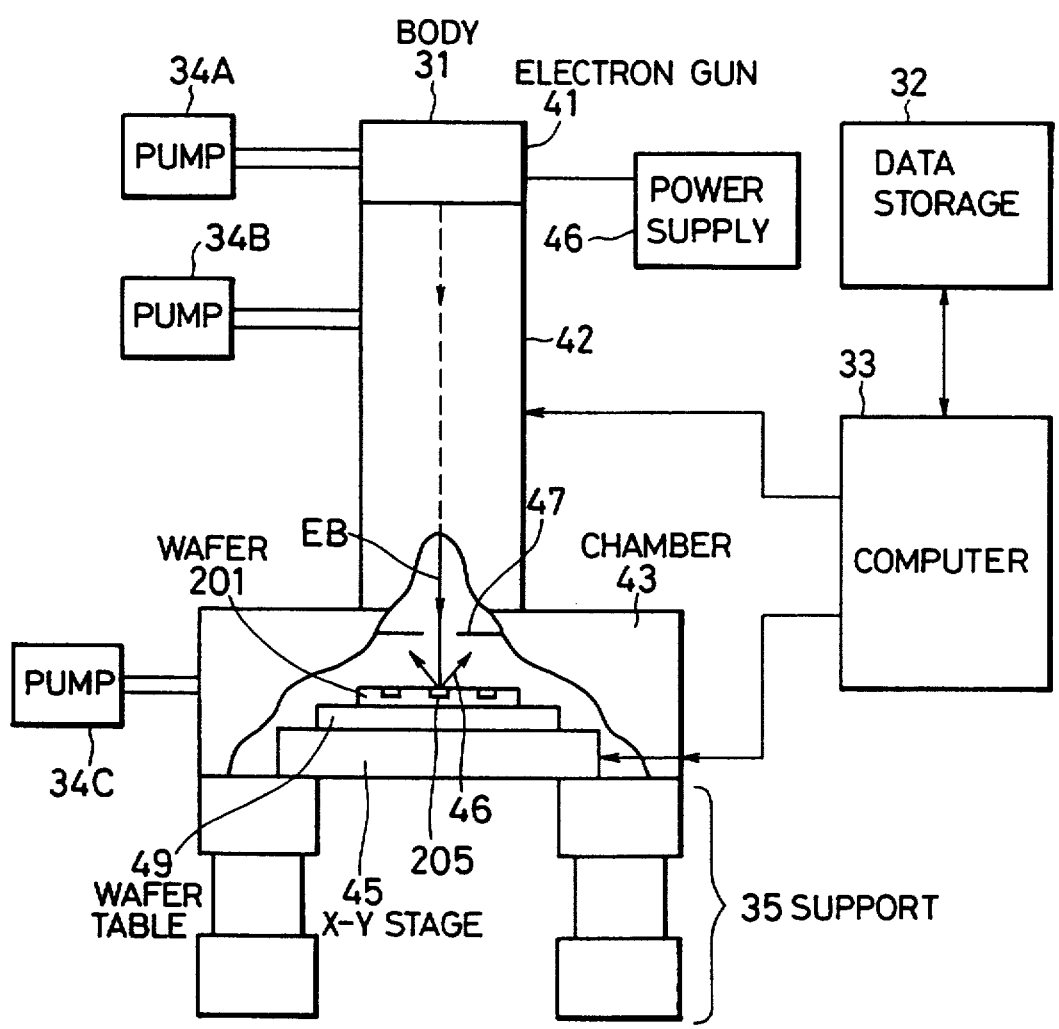
FIG. 2 is a schematic illustration of a scanning electron beam exposure system used for a directly patterning method of a resist film according to an embodiment of the invention.

A direct patterning method of a resist film using electron beam according to an embodiment of the invention is carried out using a conventional scanning electron-beam exposure system as shown in FIG. 2.

In this system, a body 31 contains an electron gun 41 from which an electron beam EB is emitted and an electron optional column 42 through which the electron beam EB thus emitted passes. The gun 41 is fixed on the top of the column 42.

The incident electrons of the beam EB emitted from the gun 41 are accelerated at a given voltage by an acceleration power supply 46 to enter the column 42.

The column 42 has several sets of electro-magnetic lens for spot shaping, blanking, positioning, and radiation-amount adjustment of the electron beam EB and a set of electrodes for forming an aperture through which the beam EB is narrowed.

A pattern-writing cheer 43 is provided at the bottom of the column 42. The cheer 43 and the body 41 are mounted on a vibration-resistant support 35 not to be affected by any vibration applied.

In the cheer 43, there are an X-Y stage 45 movable along X and Y directions perpendicular to each other in a horizontal plane, and a wafer table 49 on which a Si wafer 201 to be processed is set. The wafer 201 has alignment marks 205 on its surface. The wafer table 49 is fixed on the X-Y stage 45. The position of the table 49 is changed in the horizontal plane by the movement of the stage 45.

An electron detector 47 is provided in the chamber 43. The detector 47 is used for detecting secondary electrons 46 generated from an electron resist mask, which is different from the conventional method. The secondary electrons 46 are generated by back-scattered electrons due to striking of incident electrons to the wafer 201.

Three vacuum pumps 34A, 34B and 34C are provided for the electron gun 31, the electron optical column 42 and the pattern-writing chamber 43, respectively. The pumps 34A, 34B and 34C pump out the air contained in the gun 31, the column 42 and the cheer 43 to control their operating pressures, respectively.

A computer 33 controls the irradiation of the electron beam EB and the position of the X-Y stage 45 according to given pattern data and preset writing parameters read out from a data storage 32.

Under the control of the computer 33, the accelerated electrons of the beam EB pass through the electron optical column 42 to enter the pattern-writing chamber 43. The electrons are irradiated to the Si wafer 201 held on the wafer table 49 and is scanned for alignment and pattern-writing during different process steps.

Figure 3:
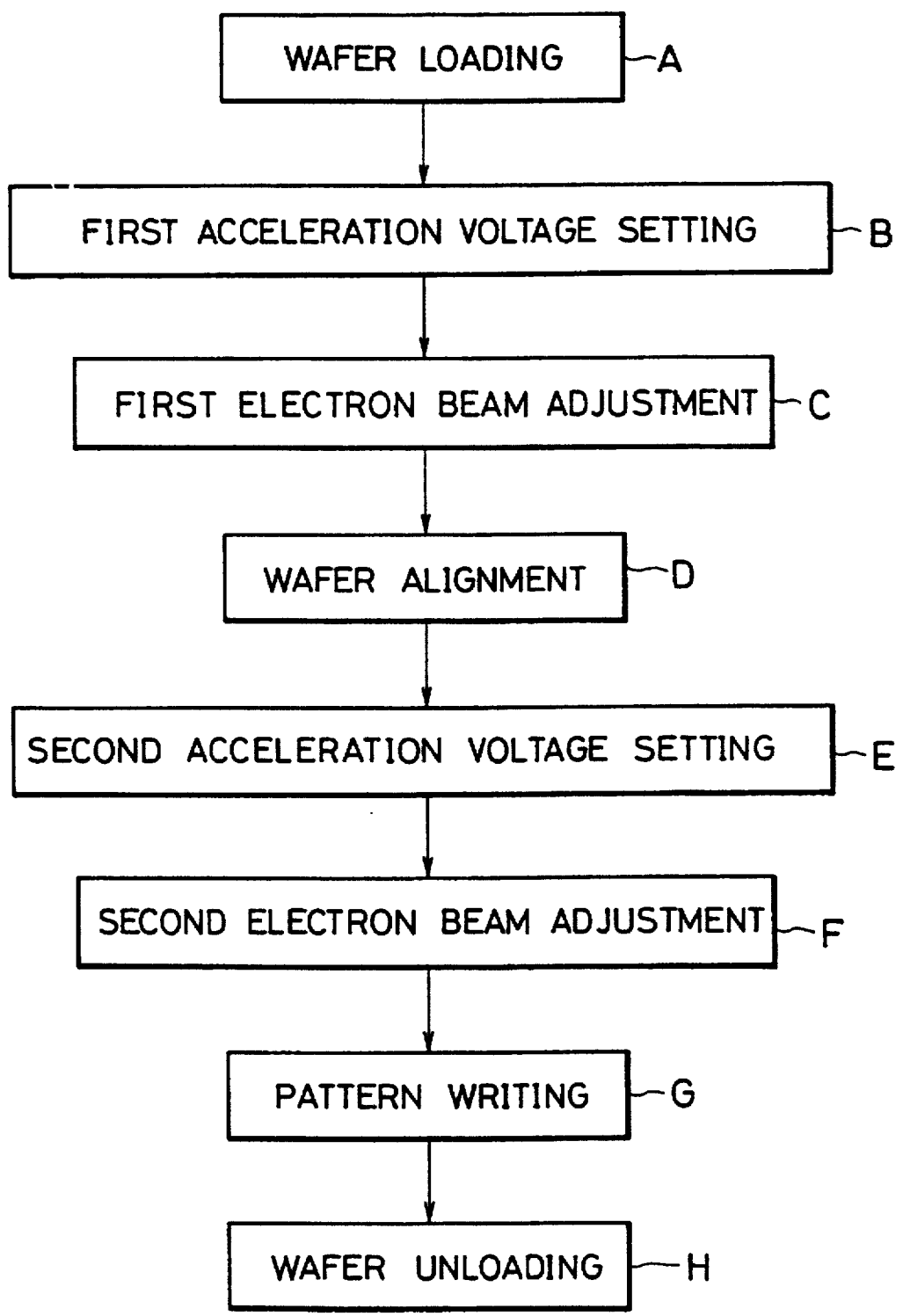
FIG. 3 is a flow chart showing the process steps of the directly patterning method of the embodiment.

The method of this embodiment is carried out according to the process sequence shown in FIG. 3.

Figure 4A:
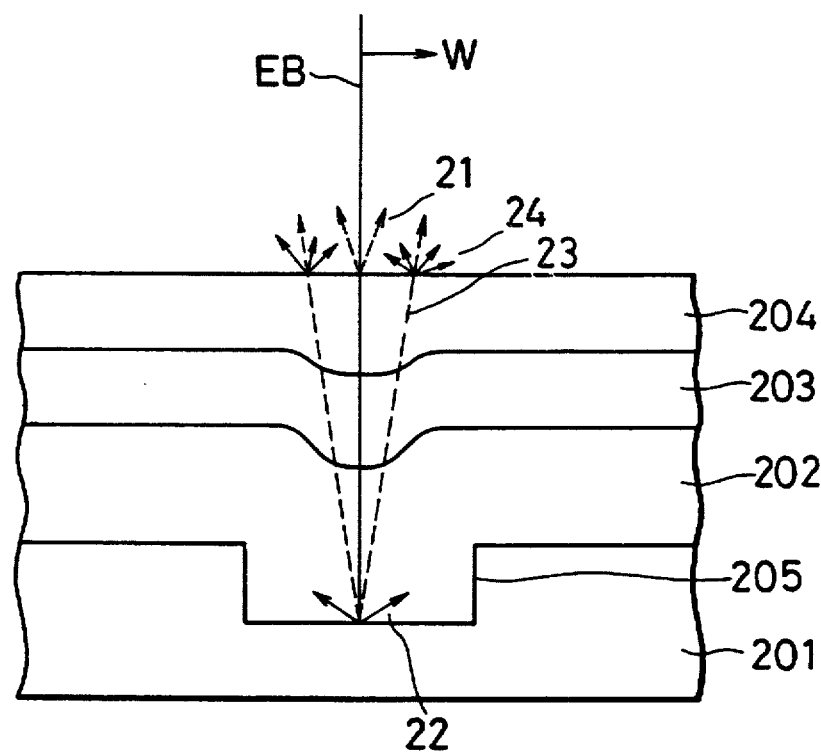
FIG. 4A is a partially cross-sectional view showing the method of the embodiment.

First, the Si wafer 201 is loaded on the wafer table 49 in the step A. As shown in FIG. 4A, the alignment marks 205 of the wafer 201 are formed by etched trenches in an exposure field of the wafer 201. On the surface of the wafer 201, a $SiO_2$ film 202 with a thickness of 0.5 to 2 μm, an Al film 203 with a thickness of 0.5 to 1.5 μm, and an electron resist fill 204 with a thickness of 2.1 to 2.5 μm are formed in this order.

Second, the acceleration voltage of the power supply 46 is adjusted to a first voltage in the range from 100 kV to 250 kV in the step B. The first acceleration voltage is set to an optimum value in accordance with the respective thicknesses and materials of the fills 202, 203 and 204.

Third, in the step C, the position and focus of the electron beam EB are adjusted by using fiducial marks or the like provided on the wafer table 49. The adjustment is carried out in accordance with the first acceleration voltage thus set.

Fourth, in the step D, a first irradiation of the electron beam EB accelerated at the first acceleration voltage is carried out to the exposure field of the wafer 201 and is scanned to cross the alignment marks 205 along the direction W. The positions of the marks 205 are recognized by detecting secondary electrons 24 generated from the resist film 206. Thus, the accurate positions and lines along which the beam EB to be scanned and the initial position of the wafer 201 are determined.

Fifth, in the step E, the acceleration voltage of the power supply 46 is adjusted again to a second voltage in the range from 20 kV to 50 kV, which is far lower than the first acceleration voltage. The second acceleration voltage is set to an optimum value in accordance with the thicknesses and the materials of the films 202, 203 and 204 to write a given pattern in the resist film 204 well.

Sixth, in the step F, the position and focus of the electron beam EB are adjusted again in the same way as that of the step C. The adjustment is carried out in accordance with the second acceleration voltage thus set.

Seventh, in the step G, a second irradiation of the electron beam EB is carried out to the exposure field of the wafer 201 and is scanned over the field to write a given pattern in the resist film 204 under the control of the computer 33.

Finally, in the step H, the wafer 201 thus pattern-written is unloaded from the wafer table 49 to be taken out of the pattern-writing chamber 43.

The above steps A to H are repeated several or several tens times according to the number of the patterns to be written for the same wafer 201. In the embodiment, since the alignment marks 205 are recognized much accurately in the step C for each of the given patterns, all the patterns can be overlaid with satisfactory accuracy even if the distance from the surface of each resist film for respective process steps to the alignment marks 205 are very large.

The sequence of the method of the embodiment is not limited to such the steps A to H, and any other sequence may be employed if it contains the steps B and E of setting the first and second acceleration voltages.

One example is as follows: The position and focus of the electron beam EB are adjusted at the first and second acceleration voltages in advance, and the control condition data thus obtained are stored in the data storage 32. Subsequently, the steps D and G are sequentially carried out according to the corresponding data read out from the storage 32.

Next, the step D of wafer alignment is described below in detail.

When the incident electrons accelerated at the first voltage of 100 kV to 250 kV are irradiated to the electron resist film 204, the incident electrons with such the high kinetic energies penetrate the resist film 204, the Al film 203 and the $SiO_2$ film 202 and strike the surface of the wafer 201. The incident electrons can keep their high kinetic energies after penetrating the films 204, 203 and 202.

The incident electrons of the beam EB are then reflected by the surface of the wafer 201 to be back-scattered electrons 23, and at the same time, secondary electrons 22 are generated at the striking point or area of the surface, as shown in FIG. 4A. The secondary electrons 22 disappear in the vicinity of the striking point in the $SiO_2$ film 202 because of their low kinetic energies.

On the other hand, since the incident electrons has such the high energies as above, the back-scattered electrons 23 also has high kinetic energies similar to those of the incident electrons. Therefore, the electrons 23 can penetrate the films 202, 203 and 204 to be emitted from the surface of the resist film 204.

On the surface of the resist film 204, the back-scattered electrons 23 produce a large number of secondary electrons 24, respectively. Each of the back-scattered electrons 23 produces several or several tens of the secondary electrons 24. In other words, the number of the secondary electrons 24 is several or several tens times as much as that of the back-scattered electrons 23.

Because the electron detector 47 detects the large number of the secondary electrons 24, an electric signal obtained by the secondary electrons 24 is higher amplitude than that by the back-scattered electrons 23, resulting in improvement in S/N.

The reference number 21 indicates back-scattered electrons generated on the surface of the resist film 204 by the incident electrons of the beam EB.

Figure 4B:
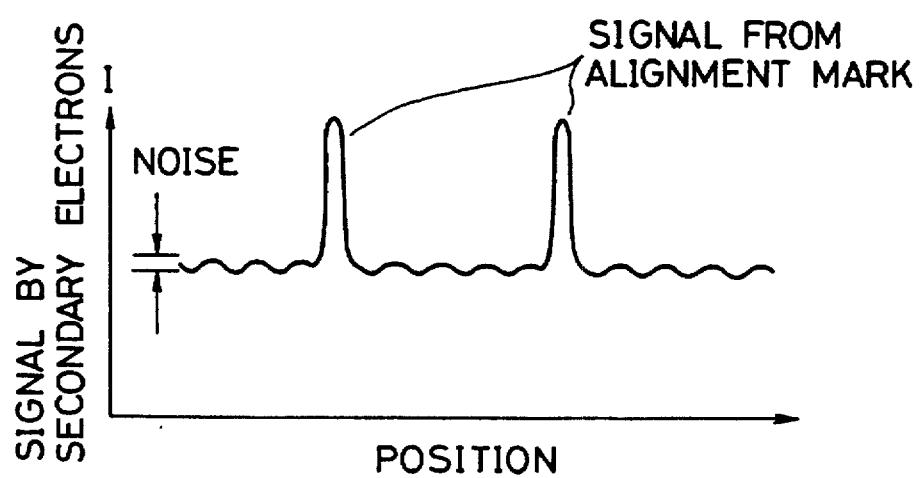
FIG. 4B is a graph showing a relationship between the position on the semiconductor substrate and the electric signal produced by the secondary electrons of the method of the embodiment.

FIG. 4B shows a relationship between the position on the wafer 201 and the electric signal produced by the secondary electrons 24 in the step of D, where the first acceleration voltage is 200 kV and a scintillator is used as the electron detector 47. It is seen from FIG. 4B that a higher S/N can be obtained for the signal and as a result, the alignment marks 205 can be recognized more accurately than the case of the conventional one. This enables increased accuracy in the alignment of the wafer 201, i.e., the overlay of the given patterns can be improved drastically.

The first acceleration voltage of 100 kV to 250 kV is determined due to the following reason:

If the first acceleration voltage is lower than 100 kV, the secondary electrons 24 decreases in number because of an increased effect of aberration of the incident electrons. This means that a sufficient number of the secondary electrons 24 is difficult to obtained.

If the first acceleration voltage is higher than 250 kV, the incident electrons tend to penetrate the wafer 201 so that the secondary electrons 24 decrease in number.

The first acceleration voltage is preferably 180 kV to 220 kV because a satisfactory number of the secondary electrons 24, i.e., a satisfactory accuracy of alignment can be obtained and electric discharge does not occur easily.

In addition, the optimum value of the first acceleration voltage is substantially equal to 200 kV because a comparatively satisfactory accuracy of alignment of the patterns can be obtained without electric discharge independent of the total thickness of the films 202, 203 and 204.

In the embodiment, although the electron resist film 204 is formed over the wafer 201 through the SiO₂ film 202 and the Al film 203, the invention is not limited to such the s tacked structure. An electron resist film may be formed on a surface of a semiconductor substrate and may be formed over the substrate through at least one of films made of conductor and/or insulator.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A direct patterning method using an electron beam, said method comprising the steps of:

(A) forming an electron resist film on or over a surface of a semiconductor substrate, said substrate having an alignment mark;

(B) irradiating a first beam of incident electrons accelerated at a first voltage to said resist film and scanning said first beam to cross said alignment mark, said first voltage being set so that said incident electrons of said first beam are reflected by said mark to be back-scattered electrons that can reach the surface of said resist film, secondary electrons being generated at the surface of said resist film due to said back-scattered electrons and being detected by an electron in order to recognize said alignment mark; and (C) irradiating a second beam of incident electrons accelerated at a second voltage lower than said first voltage to said resist film and scanning said second beam over said substrate by reference to said alignment mark in order to write a given pattern in said resist film.

2. The method as claimed in claim 1, wherein said first voltage ranges from 100 kV to 250 kV.

3. The method as claimed in claim 1, wherein said first voltage ranges from 180 kV to 220 kV.

4. The method as claimed in claim 1, wherein said substrate has an insulator film and a conductor film, said insulator film being placed on said surface of said substrate, said conductor film being placed on said insulator film, and said resist film being placed on said conductor film.

5. The method as claimed in claim 1, further comprising a combination of said steps of (A) to (C) for another pattern.

6. A direct patterning method using an electron beam, said method comprising the steps of:

(A) preparing a semiconductor substrate with an electron resist film formed on a conductor film, said conductor film being formed on an insulator film, said insulator film being formed on a surface of said substrate, said substrate having an alignment mark;

(B) loading said substrate with said resist film on a table;

(C) irradiating a first beam of incident electrons accelerated at a first voltage to said substrate placed on said table through said resist film and scanning said first beam to cross said alignment mark, said first voltage being set so that said incident electrons of said first beam are reflected by said mark to be back-scattered electrons that can reach the surface of said resist film, secondary electrons being generated at the surface of said resist film due to said back-scattered electrons and being detected by an electron detector in order to recognize said alignment mark;

(D) irradiating a second beam of incident electrons accelerated at a second voltage lower than said first voltage to said substrate placed on said table through said resist film and scanning said second beam over said substrate by reference to said alignment mark in order to write a given pattern in said resist film; and (E) unloading said substrate from said table after irradiation of said first and second beams of said incident electrons.

7. The method as claimed in claim 6, wherein said first voltage ranges from 100 kV to 250 kV.

8. The method as claimed in claim 6, wherein said first voltage ranges from 180 kV to 220 kV.

9. The method as claimed in claim 6, further comprising a combination of said steps of (A) to (E) for another pattern.

* * * * *